US006859115B1

(12) United States Patent
Hirsch et al.

(10) Patent No.: US 6,859,115 B1
(45) Date of Patent: Feb. 22, 2005

(54) STUB TRANSFORMER FOR POWER SUPPLY IMPEDANCE REDUCTION

(75) Inventors: Tom J. Hirsch, Austin, TX (US); Benjamin Beker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 159 days.

(21) Appl. No.: 10/109,179

(22) Filed: Mar. 28, 2002

(51) Int. Cl.[7] ............................ H03H 7/00; H03H 7/38
(52) U.S. Cl. .......................... 333/181; 333/33; 333/263
(58) Field of Search ............................ 333/32, 33, 263, 333/181, 185, 204

(56) References Cited

U.S. PATENT DOCUMENTS 3,662,294 A * 5/1972 Jacobs et al. ................. 333/33
6,101,295 A * 8/2000 Mineo et al. .................. 385/1
6,525,630 B1 * 2/2003 Zhu et al. ................... 333/205

OTHER PUBLICATIONS

Audio/Modem Riser Specification, Intel Corporation, Revision 1.01, Sep. 10, 1998, pp. 1–24.*
"Engineering Electromagnetic Fields and Waves," Carl T. A. Johnk, John Wiley & Sons, Inc., 1975, pp. 568–570.

* cited by examiner

*Primary Examiner*—Stephen E. Jones
(74) *Attorney, Agent, or Firm*—Meyertons Hood Kivlin Kowert & Goetzel, P.C.; B. Noël Kivlin

(57) ABSTRACT

A computer power supply system for reducing the AC impedance of a DC power supply (52) at inputs pins of a computing device (54) such as a processor. A quarter wavelength transmission line stub (58) is connected to a computing device DC power supply input pin. The stub is open circuited at its end opposite the pin. The wavelength is selected to match a frequency at which power supply impedance is known to be high. The stub appears as a low impedance at the selected frequency. Multiple stubs at different frequencies may be used to provide reduced impedance over a broader frequency band. Stubs may be formed from printed circuit board traces on a motherboard of from metalization patterns on a computing device package.

21 Claims, 6 Drawing Sheets

STUB TRANSFORMER FOR POWER SUPPLY IMPEDANCE REDUCTION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention generally relates to computer systems and more particularly to a computer system having a power supply including a transmission line stub coupled to a processor chip.

Computers, including personal computers, servers, workstations, etc., are continually being improved with more processing power and memory. Processing speed has been increased well above 100 megahertz. Processing power improvement involves such speed improvements as well as use of more computing devices, such as digital signal processors and programmable logic cores, which may be included in computers. Nearly all such improvements cause the total power used by a computer to increase and generate more heat which must be removed to avoid damage to the circuits.

One approach to increasing processing power without overheating circuits has been to operate computer chips at lower voltages. At one time, the standard DC power supply for computers was five volts DC. Circuits have since been developed which operate at lower voltages including 3.3 volts, 1.8 volts and 1.2 volts. With each voltage reduction, computer performance has been improved, while power dissipation has been controlled.

At the low operating voltages, it becomes more important to avoid AC noise on the DC power supply busses and connections to the functional circuits. There is little margin for error at the low voltages. An internal source of AC noise on DC power supply lines is the switching transients generated by the chips themselves, and particularly by the output drivers which drive signals from each chip to other chips, signal busses, etc. Transients generated on a given chip will appear on that chip's own power inputs and can affect all circuits on the chip. It is important that the AC impedance of the DC power supply be as low as possible at the power supply inputs of processor chips to minimize noise.

It is well known to use capacitors to reduce the AC impedance of DC power supplies. Such capacitors may be placed on a computer motherboard near the power supply pins of the processing chips. Capacitors may also be placed on chip packages, especially on microprocessor packages. It is known that essentially all capacitors are somewhat inductive and have a resonance frequency at which they have low AC impedance. Above the resonance frequency, the parasitic inductance causes the impedance of a capacitor to increase. Smaller value capacitors have higher resonance frequency and are often used in parallel with larger value capacitors to remove AC noise from DC power supply lines over a broader frequency band. As circuit operating speed has increased, the frequency of power supply noise sources has also increased. Adding capacitors to a motherboard or package is expensive in terms of the cost of the capacitors themselves, the space required on the motherboard and the assembly time and expense required for additional components.

It would be desirable to provide a DC power supply system with low AC impedance for computer systems which minimizes the need for capacitors or at least for high resonance frequency capacitors.

BRIEF SUMMARY OF THE INVENTION

A computer system according to the present invention includes a transmission line stub coupled to a computer device DC power input. The stub is tuned to a frequency at which power supply AC impedance needs to be minimized.

In one embodiment, the stub is formed by a strip line on a printed circuit board. The strip line is one quarter wavelength long at a selected frequency and is open circuited at one end. The other end is coupled to a power input of a computer chip.

In another embodiment, the stub is formed of metallization on a package to which a computer chip is mounted.

In another embodiment, multiple stubs may be used together. A stub on the motherboard may be connected to the power input of a chip having a stub in its package. Multiple stubs connected to the same power supply input may also be formed on a printed circuit board or the package. Each of multiple stubs may be tuned for a different frequency to broaden the frequency band over which power supply AC impedance is reduced.

BRIEF DESCRIPTION OF THE DRAWINGS

For a detailed description of embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

Unless otherwise indicated, references to impedance are intended to refer to AC or complex impedance and not to DC resistance.

DETAILED DESCRIPTION OF EMBODIMENTS

Figure 1:
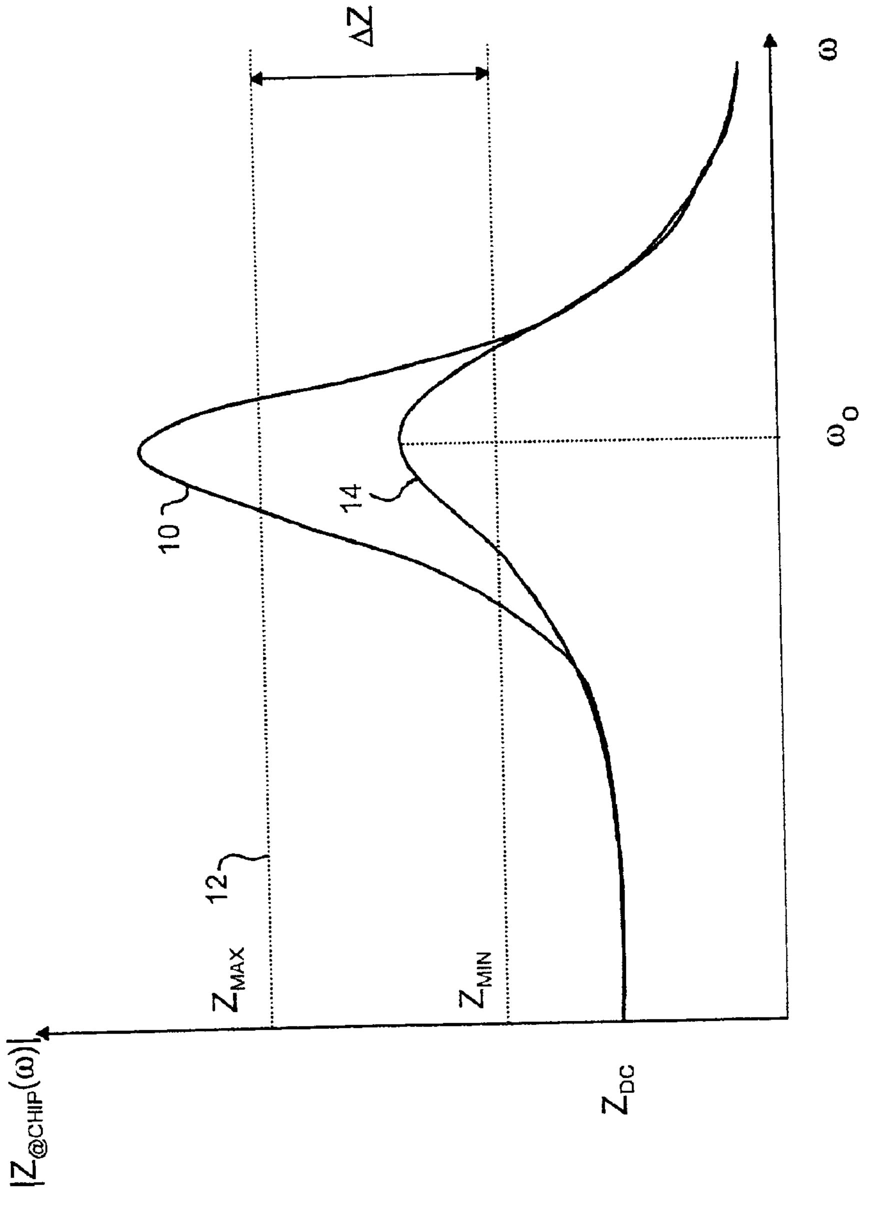
FIG. 1 is a plot of the frequency response of power delivery system impedance at a chip input.

Referring now to FIG. 1, there is provided a plot of the AC impedance of a DC power supply versus frequency as seen from the power input of a computer chip. In this plot, frequency, w, is shown on the horizontal axis and the magnitude of the impedance, Z, is shown on the vertical axis. The impedance $Z_{DC}$ is the impedance of the DC power source at low frequency, effectively at zero frequency. The curve 10 illustrates a typical prior art impedance curve. As frequency increases, the curve 10 reaches a peak at $\omega_0$. The frequency $\omega_0$ is typically in the range of 100 to 200 megahertz, which unfortunately is also the range in which the output drivers of many computer processors, digital signal processors, and other computer devices operate. It is also difficult or expensive to provide capacitors which have a low impedance resonance in this range and have sufficient capacitance to provide meaningful impedance reduction. The impedance value $Z_{MAX}$ at dotted line 12 is a maximum impedance above which AC noise on DC power supply inputs may cause errors in the computing devices. The curve 14 illustrates a desired response with a lower maximum AC impedance which is safely below the value $Z_{MAX}$.

In the present invention, we have discovered a system and method for reducing the AC impedance of the DC power supply as seen from the power input of a computing device. Instead of trying to find lumped element capacitors with high resonant frequency, we have found that transmission line stubs can be used to reduce AC impedance. Transmission line stubs or stub transformers are short sections of transmission line. A typical stub has one end either short circuited or open circuited. They are often referred to as transformers or stub transformers, because at a given frequency a shorted stub appears at its other end as an open circuit. Likewise, an open circuited stub appears to be a short circuit. This transformation occurs at a transmission line length of one quarter of a wavelength at the selected frequency, or at any odd multiple of one-quarter wavelength. If an open circuited stub tuned to the frequency $\omega_0$ is connected to a computer device DC power input pin, it will provide a low impedance in a frequency band centered on $\omega_0$. It can help move from curve 10 of FIG. 1 to the curve 14.

Any known form of transmission line is useful in the present invention. The embodiments described herein use a form of strip transmission line because strip lines are simple to implement on a printed circuit board or chip package. Various embodiments of strip transmission line are described in more detail below. Other forms of transmission line, such as coaxial and parallel wire lines can also be used if desired.

Figure 2:
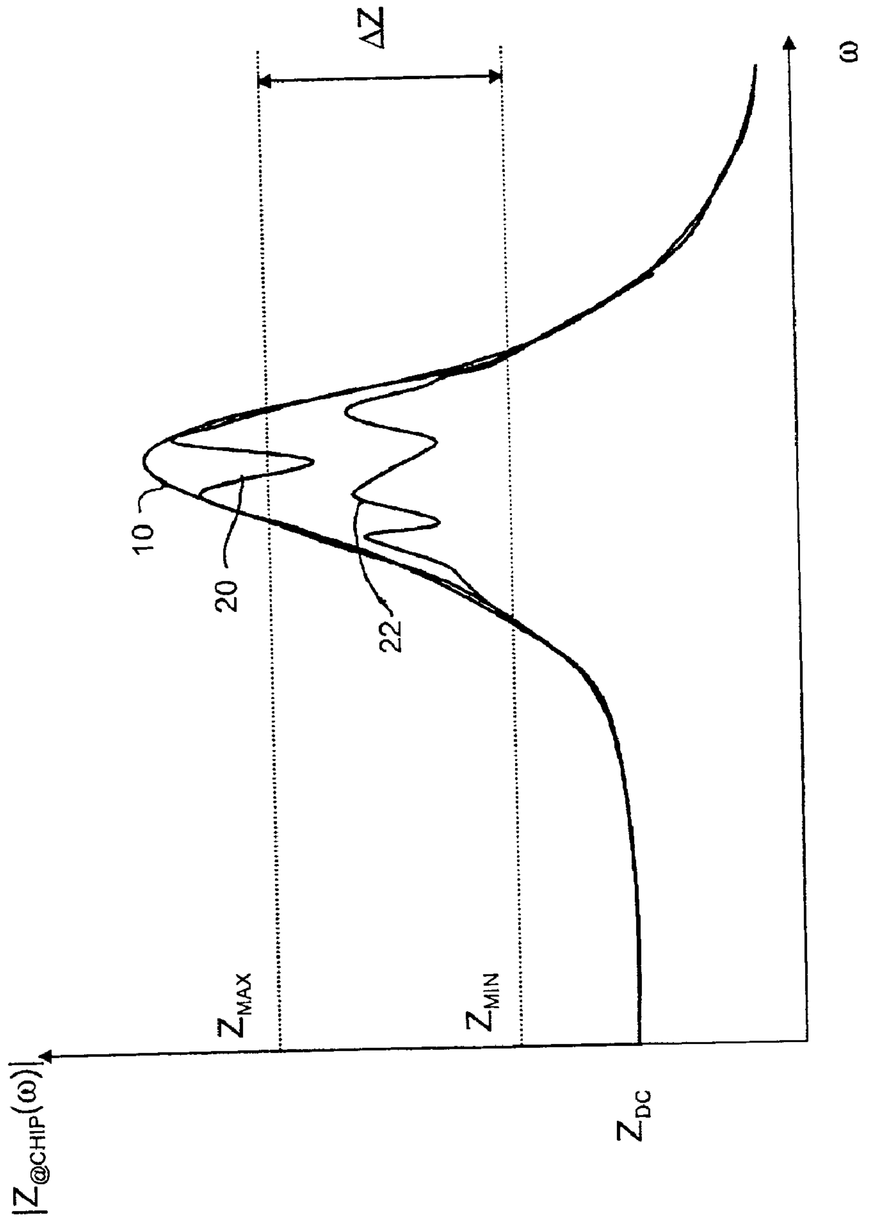
FIG. 2 is a plot of the frequency response of power delivery system impedance at a chip input showing the effect of stub tuners.

FIG. 2 is another plot like FIG. 1 and again shows the undesired or untuned frequency response 10 according to the prior art. A second plot 20 illustrates the effect of adding one stub tuner to the circuit. This one stub provides a reduction in impedance at the peak impedance frequency of curve 10. Since stub tuners have a limited bandwidth, this example does not bring the whole curve 10 down below $Z_{MAX}$. A curve 22 illustrates the use of multiple stubs, each tuned to a different frequency. Each stub is an open circuited quarter wavelength transmission line stub at the selected frequencies. The combined effect of multiple stubs can reduce the AC impedance below $Z_{MAX}$ over a wider frequency band.

Figure 3:
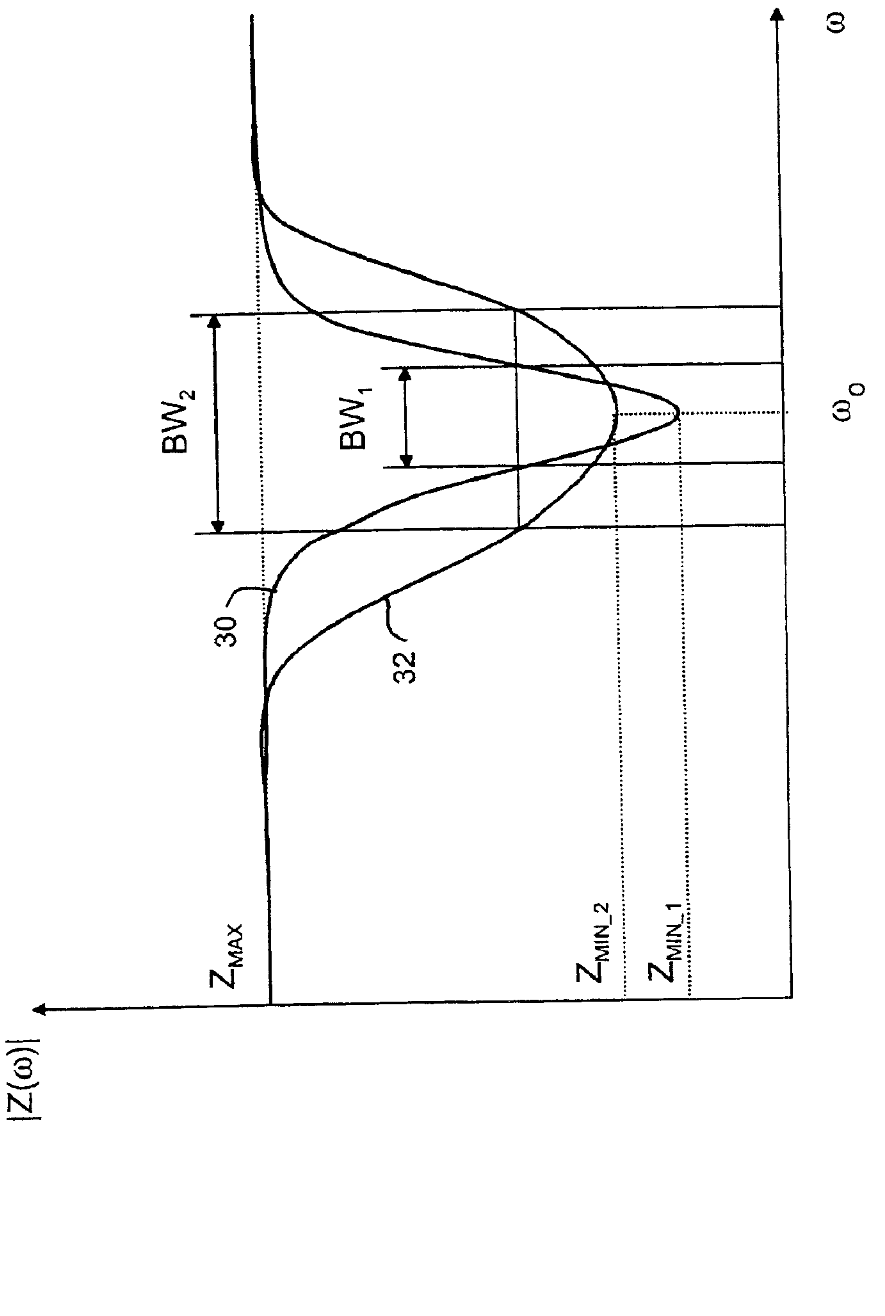
FIG. 3 is a plot illustrating the relationship between bandwidth and impedance reduction of various stubs.

FIG. 3 illustrates the relationship between impedance and bandwidth for a single transmission line stub. Curve 30 illustrates a first stub having a bandwidth of $BW_1$ and a minimum impedance of $Z_{MIN1}$. Curve 32 illustrates a second stub having a bandwidth of $BW_2$ and a minimum impedance of $Z_{MIN2}$. Curve 30 provides a greater impedance reduction, but has a more narrow bandwidth. Curve 32 provides less impedance reduction, but has a wider bandwidth. These curves illustrate the tradeoff of impedance reduction and bandwidth. These curves also illustrate the difference in quality factor, Q, for the two curves. Curve 30 represents a stub with higher Q than the stub represented by curve 32.

The Q of a stub can be adjusted in various ways. In the preferred embodiments, the transmission line stub is formed by metal traces on a chip package or on a printed circuit board to which the package is attached. The resistance of the metal traces affects the Q of the stubs. As resistance increases, the Q decreases. As Q decreases, the bandwidth increases, but the impedance minimum is not as deep, i.e. the stub does not provide as much impedance reduction. With reference to FIG. 2, it can be seen that curve 20 provides sufficient impedance reduction at its deepest point, but does not have enough bandwidth. If a stub with lower Q is used, the bandwidth may be increased to the desired point, but the maximum impedance reduction would be less and would likely not bring the total curve below $Z_{MAX}$.

Figure 4:
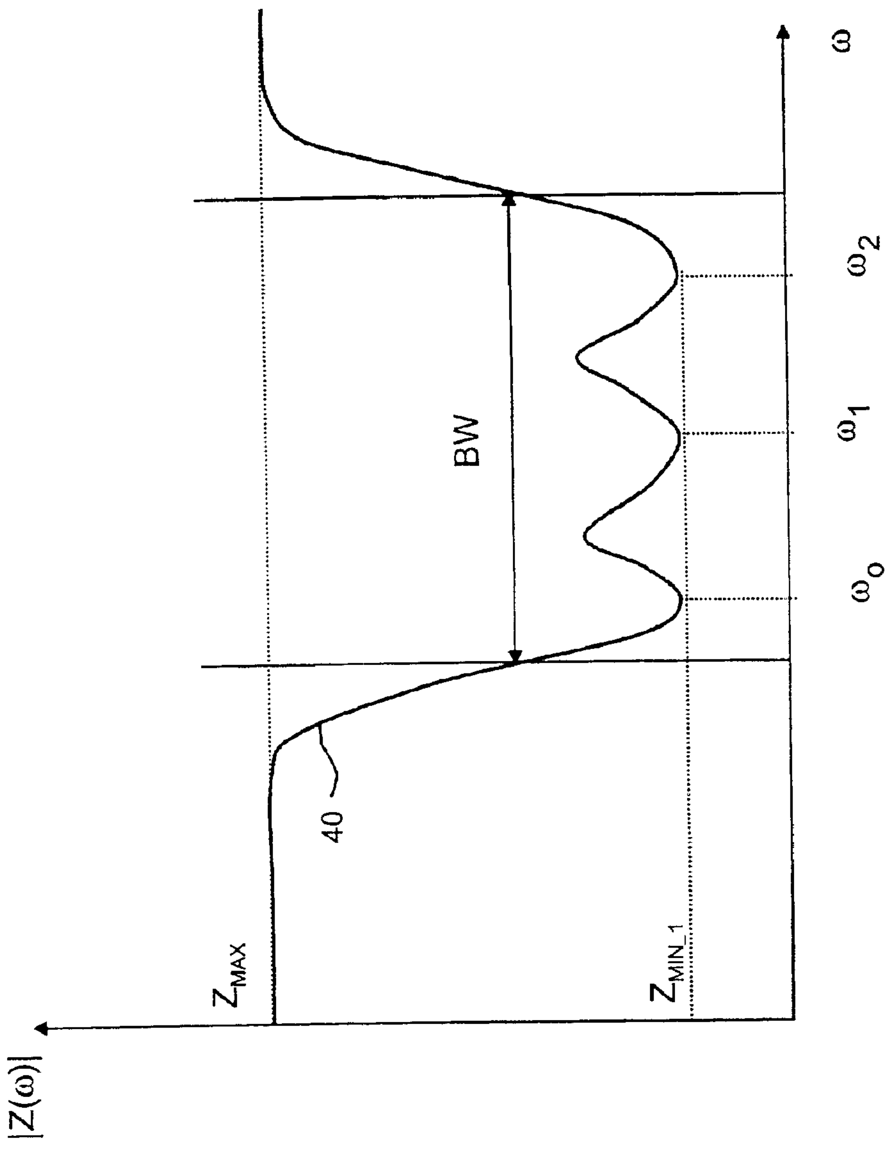
FIG. 4 is a plot illustrating the combination of three stubs to provide expanded bandwidth with increased impedance reduction.

FIG. 4 illustrates the frequency response 40 of a three-stub tuner, i.e. a combination of three stubs tuned to three different frequencies, $\omega_0$, $\omega_1$ and $\omega_2$. The three stubs are preferably open circuited stubs each being one quarter wavelength at the three frequencies $\omega_0$, $\omega_1$ and $\omega_2$. One end of each stub is connected to the same point for which the impedance is plotted. The impedance is the combination of three separate curves like the FIG. 3 curve. The three stubs can be designed with relatively high Q to provide greater impedance reduction. Increased bandwidth is achieved by using three stubs in combination with tuning frequencies selected across the frequency band over which impedance needs to be reduced. The number of stubs can be increased to further broaden the bandwidth over which impedance is reduced. Models with five stubs have shown good results in computer simulations.

Figure 5:
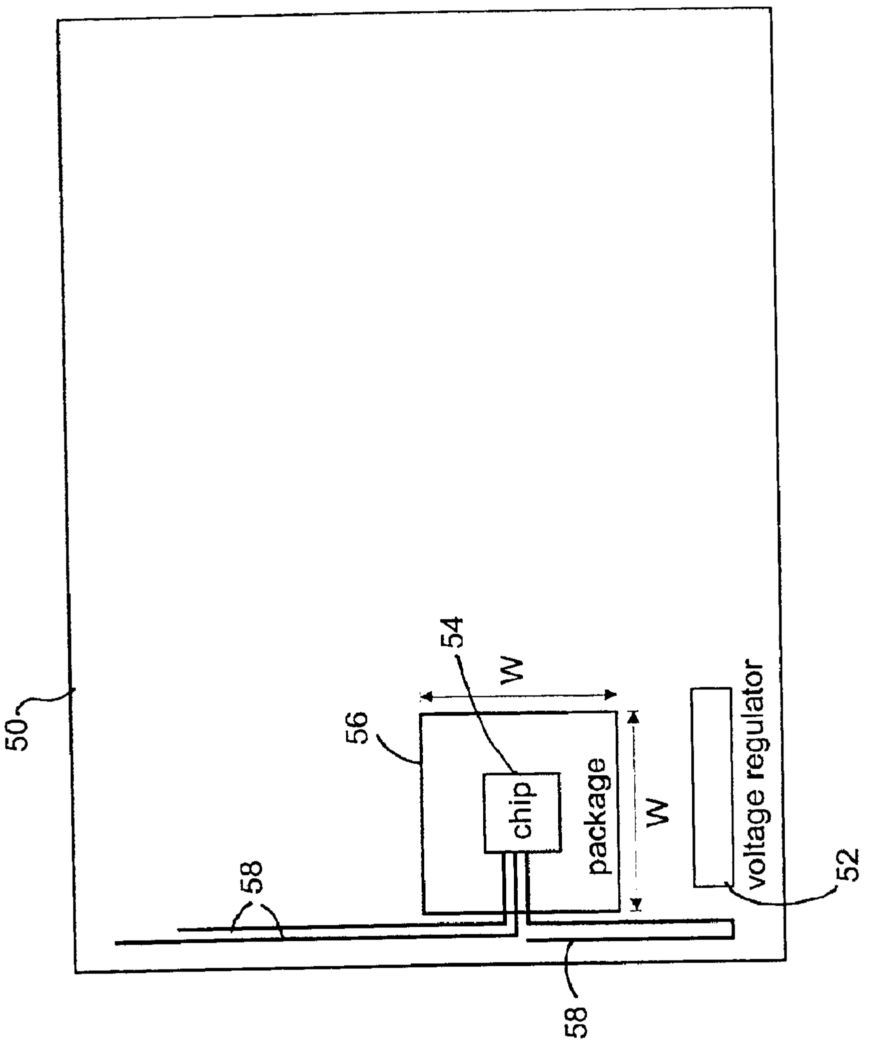
FIG. 5 is a plan view of a computer printed circuit board illustrating the arrangement of a computer device and stubs on the printed circuit board.

FIG. 5 illustrates a portion of a typical computer printed circuit board layout. A printed circuit board 50, often referred to as a motherboard, has multiple layers of conductive metal traces and power planes, usually copper, laminated to and between insulating dielectric layers. Various components and chips are carried on the board and may be directly soldered to conductors on the board 50 or plugged into sockets which are directly soldered to the board. A voltage regulator 52 is mounted on the board and provides the DC voltages which are needed by the functional components. Regulated voltages from regulator 52 are coupled to power supply traces and/or power planes on the board 50 which couple the DC power to each of the functional components, i.e. chips, on the board. Multilayer circuit boards often have both positive and negative power planes, with the negative power plane usually considered to be the ground plane. A processing chip 54 is shown mounted on a package 56 which is mounted on the circuit board 50. Package 56 may be formed of multiple ceramic layers with metallization patterns, including traces and power and ground planes, screen-printed and fired on the surfaces of the various layers forming a conductor pattern similar to a multilayer printed circuit board. Package 56 may also be formed of multiple organic layers with metallization patterns like a multilayer printed circuit board. The package includes pins, not shown, for either direct connection to the board 50 or for plugging into a socket. The metal traces and planes on the package 56 provide electrical connections between the package pins and the chip 54.

In FIG. 5, three metal traces 58 are shown positioned on the board 50 and connected together to the chip 54 through package 56. Each trace is illustrated as a single metal trace. A transmission line stub may be formed by positioning these traces above traces of the same shape on an adjacent layer and spaced apart or separated by a dielectric layer forming the structure of the board 50. Alternatively, any of the strip line arrangements shown in FIG. 7 may be used. A typical motherboard has dimensions of about 12 inches (30.5 cm) by 10 inches (25.4 cm). The organic dielectric material typically used in printed circuit boards has a relative dielectric constant of about 4. A quarter wavelength stub, tuned for about 150 MHz, can be formed from metal traces along one edge of such boards or doubled back in less than one half the board width if desired. Typical designs for stubs tuned to frequencies centered at 150 MHz have trace widths between 1 mm and 2 mm and trace lengths between 21 cm and 30 cm. These designs provide a relatively low resistance, since the sheet resistance of metallization on the signal layers of a motherboard is about 0.001 ohms per square.

Figure 6:
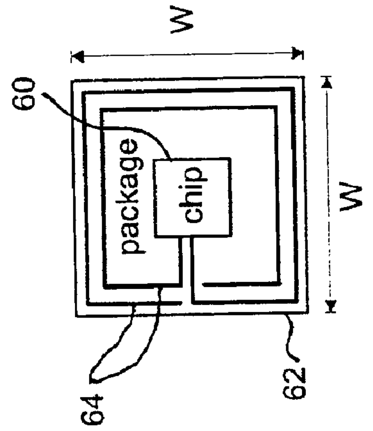
FIG. 6 is a plan view of a computer device package with stubs on the package.

FIG. 6 illustrates transmission line stubs formed on a chip package. A computer chip 60, e.g. a microprocessor, is shown mounted on a package 62. Package 62 is often formed of ceramic with metal patterns as described above. In this embodiment, the metallization pattern includes two transmission line stubs 64 formed about the perimeter of the package. The package 62 may be square as illustrated with a length and width of about 1.5 to 2 inches (3.8 to 5.1 cm). Since ceramic has a relative dielectric constant of about ten, a quarter wavelength stub at about 150 megahertz can be formed by a metal trace extending one time around the perimeter of the package. As with the printed circuit board embodiments, the stub may be formed from two matching traces on adjacent conductor layers or any of the other forms shown in FIG. 7. If a chip package is made of organic dielectric material, the length of the traces would be longer, due to the lower relative dielectric constant of the organic dielectric.

The embodiments of FIGS. 5 and 6 can be used as alternatives or together. The package with one or more integral stubs 64 may be installed on a printed circuit board 50, which also has one or more stubs 58 connected to the power input for the chip. This allows flexibility of design. The various alternatives can be compared for cost, availability of space on the board 50 versus the package 64, etc. The sheet resistance of metallization used on ceramic packages is typically about 0.01 ohms per square, i.e. about ten times greater than for typical printed circuit board conductors. Stubs formed on packages therefore tend to be of lower Q value and therefore tend to provide wider bandwidth, but less impedance reduction.

Figure 7:
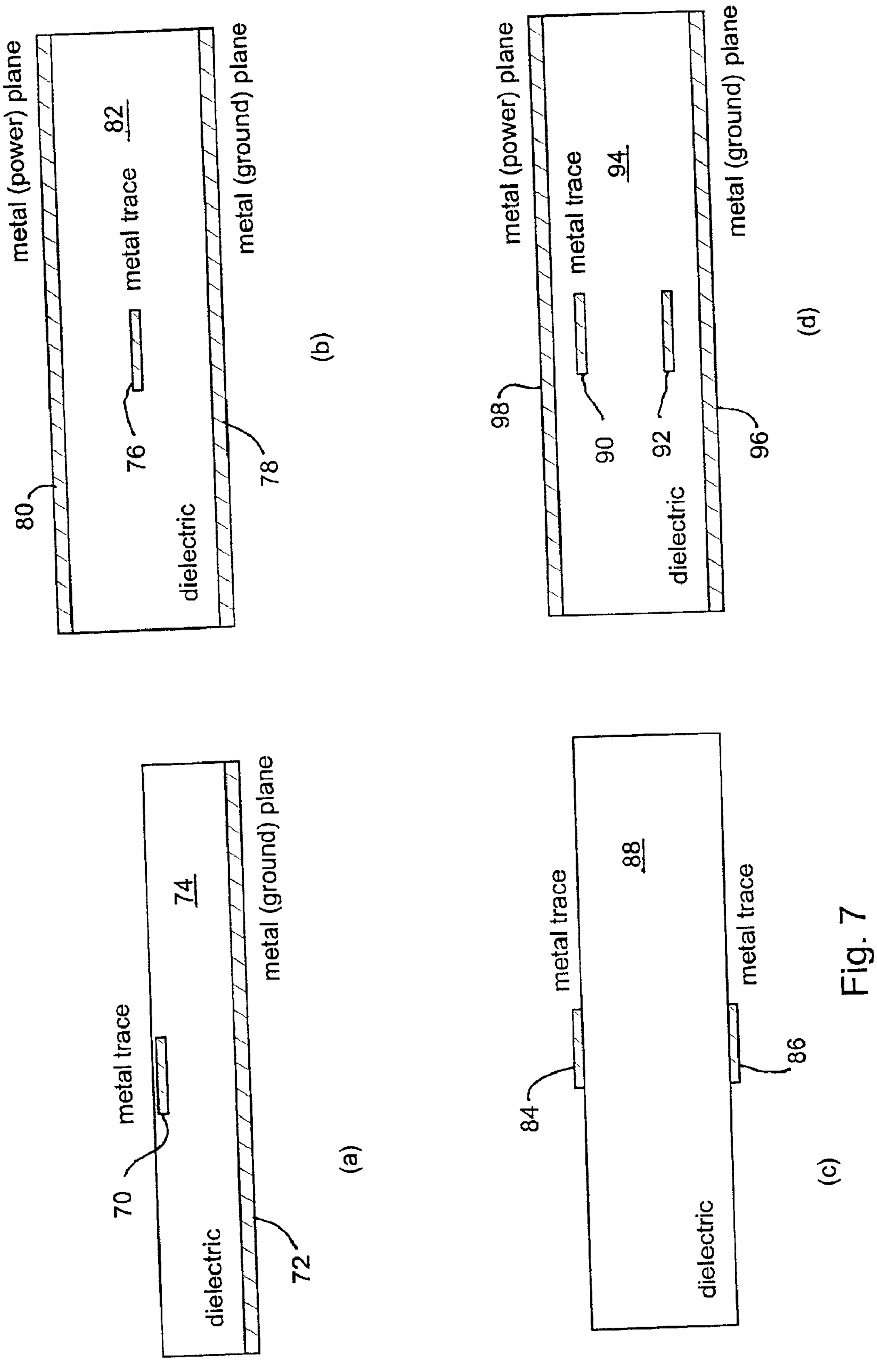
FIGS. 7(*a*) through 7(*d*) are cross sectional illustrations of various embodiments of strip transmission lines.

FIG. 7 provides four examples (a), (b), (c) and (d) of strip transmission line structures which may be implemented on multilayer printed circuit boards or multilayer packages. The structure shown in FIG. 7(*a*) is a micro-strip line having a metal trace 70 spaced from a metal ground plane 72 by a dielectric layer 74. The FIG. 7(*b*) strip line embodiment is a metal trace 76 spaced between a metal ground plane 78 and a metal power plane 80 by a dielectric material 82. The FIG. 7(*c*) embodiment is a broadside-coupled line comprising two parallel metal traces 84 and 86 spaced apart by a dielectric layer 88. FIG. 7(*d*) is another broadside coupled embodiment in which metal traces 90 and 92 are spaced apart by dielectric 94. Trace 90 is also spaced apart from metal power plane 98 by the dielectric 94 and trace 92 is spaced apart from a metal ground plane 96 by the dielectric 94. The dielectric layers 74, 82, 88, and 94 may by organic or ceramic.

The physical length of a strip line and the relative dielectric constant determine the electrical length of a strip line in terms of wavelengths. The width and thickness of the strips and conductivity of the metallization determine the resistance of the strip line which affects the quality factor, Q, and bandwidth as explained above.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:

a computing device having a DC power input, and a transmission line stub having a first end coupled to said computing device DC power input, wherein the transmission line stub is tuned to a frequency such that power supply AC impedance as seen from the DC power input is minimized.

2. A computer system according to claim 1, wherein:

said stub has a length of one quarter of a wavelength at a preselected frequency.

3. A computer system according to claim 2, wherein:

said transmission line stub has an open circuit at a second end opposite said first end.

4. A computer system according to claim 1, further comprising:

a plurality of transmission line stubs, each having a first end coupled to said computing device DC power input.

5. A computer system according to claim 4, wherein:

each of said plurality of transmission line stubs has a length of one quarter wavelength at one of a plurality of preselected frequencies.

6. A computer system according to claim 5, wherein:

each of said plurality of transmission line stubs has an open circuit at a second end opposite said first end.

7. A computer system according to claim 1, further comprising:

a DC power supply, a printed circuit board coupling said DC power supply to said DC power input, and at least one trace on said printed circuit board forming said transmission line stub.

8. A computer system according to claim 7, wherein;

said transmission line stub is a section of strip transmission line formed of two spaced apart metal traces having about the same length and width dimensions.

9. A computer system according to claim 7, wherein;

said transmission line stub is a section of strip transmission line formed of a first trace having a preselected width and length spaced apart from at least one of a ground plane or a power plane.

10. A computer system according to claim 1, wherein:

said computing device comprises a chip mounted on a package.

11. A computer system according to claim 10, further comprising:

at least one trace on said package forming said transmission line stub.

12. A computer system according to claim 11, wherein;

said transmission line stub is a section of strip transmission line formed of two spaced apart metal traces having about the same length and width dimensions.

13. A computer system according to claim 11, wherein;

said transmission line stub is a section of strip transmission line formed of a first trace having a preselected width and length spaced apart from at least one of a ground plane or a power plane.

14. A computer system, comprising:

a computing device having a DC power input;

a power supply coupled to the DC power input; and a transmission line stub having a first end coupled to said computing device DC power input, the transmission line stub having a length based on an odd multiple of a quarter wavelength of a frequency for which an AC impedance as seen from the DC power input be minimized.

15. A method of reducing the AC impedance of a DC power supply in a computer system, comprising:

coupling one end of a transmission line stub to a DC power input of a computing device; and tuning the transmission line stub to a frequency such that power supply AC impedance as seen from the DC power input is minimized.

16. A method according to claim 15, wherein:

said stub is formed from at least one trace on a printed circuit board.

17. A method according to claim 15, wherein:

said stub is formed from at least one trace on a package in which said computing device is mounted.

18. A method according to claim 15, wherein:

said stub has a length of one-quarter wavelength at a preselected frequency.

19. A method according to claim 18, wherein:

said stub is open circuited at a second end opposite said first end.

20. A method according to claim 15 further comprising:

coupling one end of each of a plurality of transmission line stubs to a DC power input of a computing device.

21. A method of reducing an AC impedance of a DC power supply in a computer system, comprising:

selecting a length for a transmission line stub, wherein the length is selected based on an odd multiple a quarter wavelength of a frequency for which the AC impedance supply is to be minimized; and coupling one end of the transmission line stub to a DC power input of a computing device, wherein said coupling minimizes AC impedance as seen from the DC power input.

* * * * *

UNITED STATES PATENT AND TRADEMARK OFFICE

CERTIFICATE OF CORRECTION

PATENT NO. : 6,859,115 B1 — Page 1 of 1

DATED : February 22, 2005

INVENTOR(S) : Tom J. Hirsch et al.

It is certified that error appears in the above-identified patent and that said Letters Patent is hereby corrected as shown below:

Column 8,

Line 22, please change "multiple a quarter" to -- multiple of a quarter --.

Signed and Sealed this

Seventh Day of June, 2005

JON W. DUDAS

*Director of the United States Patent and Trademark Office*